United States Patent
Takada et al.

(10) Patent No.: US 7,893,536 B2
(45) Date of Patent: Feb. 22, 2011

(54) SEMICONDUCTOR DEVICE

(75) Inventors: Shuichi Takada, Kanagawa-ken (JP);
Shinya Kawakami, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 585 days.

(21) Appl. No.: 11/430,378

(22) Filed: May 8, 2006

(65) Prior Publication Data

US 2006/0264040 A1 Nov. 23, 2006

(30) Foreign Application Priority Data

May 9, 2005 (JP) .............................. 2005-135890

(51) Int. Cl.
  *H01L 23/48* (2006.01)
  *H01L 23/52* (2006.01)
  *H01L 29/40* (2006.01)
(52) U.S. Cl. ................................. 257/758; 257/E23.02
(58) Field of Classification Search ................. 257/758, 257/E23.02
See application file for complete search history.

(56) References Cited

U.S. PATENT DOCUMENTS

| | | | | |
|---|---|---|---|---|
| 5,736,791 A * | 4/1998 | Fujiki et al. | .................. | 257/781 |
| 6,060,784 A * | 5/2000 | Oda | .......................... | 257/758 |
| 6,100,589 A * | 8/2000 | Tanaka | ...................... | 257/758 |
| 6,163,074 A * | 12/2000 | Lee et al. | ..................... | 257/734 |
| 6,198,170 B1 * | 3/2001 | Zhao | ............................ | 257/784 |
| 6,232,662 B1 * | 5/2001 | Saran | .......................... | 257/750 |
| 6,313,024 B1 * | 11/2001 | Cave et al. | ................... | 438/598 |
| 6,313,537 B1 * | 11/2001 | Lee et al. | ..................... | 257/758 |
| 6,316,801 B1 * | 11/2001 | Amanuma | .................. | 257/306 |
| 6,596,624 B1 * | 7/2003 | Romankiw | .................. | 438/619 |
| 6,740,985 B1 * | 5/2004 | Zhao | ........................... | 257/784 |
| 6,765,298 B2 | 7/2004 | Chin et al. | | |
| 6,803,302 B2 * | 10/2004 | Pozder et al. | ............... | 438/612 |
| 6,909,196 B2 | 6/2005 | Batra et al. | | |
| 7,115,985 B2 * | 10/2006 | Antol et al. | .................. | 257/700 |

(Continued)

FOREIGN PATENT DOCUMENTS

JP 02-003944 A 1/1990

(Continued)

OTHER PUBLICATIONS

English translation of Japanese Office Action issued Aug. 25, 2010, in counterpart Japanese patent application No. 2005-135890.

*Primary Examiner*—David A Zameke
*Assistant Examiner*—Igwe U Anya
(74) *Attorney, Agent, or Firm*—DLA Piper LLP (US)

(57) ABSTRACT

A multilayer interconnect configuration is formed on a semiconductor substrate where a semiconductor integrated circuit is provided. Each layer of the multilayer interconnect configuration has a plurality of pads. Except for the pads of the top layer, the area of the pads is reduced relative to the pads of the top layer. The pad area is reduced by forming a plurality of openings in the pads, or by forming a plurality of notches in the pads whereby the pads have a comb configuration. The capacitance can be significantly reduced by decreasing the area. The reduction of capacitance allows for significantly reducing the effect of a low-pass filter produced from the interconnect metal resistance and the pad capacitance, which slows down the circuit operation. Therefore the high-speed operation can avoid degradation.

10 Claims, 8 Drawing Sheets

U.S. PATENT DOCUMENTS

| | | | |
|---|---|---|---|
| 7,276,776 B2 * | 10/2007 | Okuda et al. | 257/532 |
| 2001/0010407 A1 * | 8/2001 | Ker et al. | 257/781 |
| 2003/0111732 A1 * | 6/2003 | Goda et al. | 257/758 |
| 2003/0218259 A1 * | 11/2003 | Chesire et al. | 257/786 |
| 2005/0127496 A1 * | 6/2005 | Kwon et al. | 257/700 |
| 2006/0097396 A1 * | 5/2006 | Kamiyama et al. | 257/758 |
| 2006/0170108 A1 * | 8/2006 | Hiroi | 257/774 |
| 2006/0207790 A1 * | 9/2006 | Choi | 174/262 |
| 2007/0102787 A1 * | 5/2007 | Goebel et al. | 257/532 |
| 2007/0224794 A1 * | 9/2007 | Tsai et al. | 438/597 |
| 2008/0251929 A1 * | 10/2008 | Kageyama | 257/773 |

FOREIGN PATENT DOCUMENTS

| | | |
|---|---|---|
| JP | 03-019248 A | 1/1991 |
| JP | 03-038043 A | 2/1991 |
| JP | 11-168101 A | 6/1999 |
| JP | 11-186320 A | 7/1999 |
| JP | 2003-086589 A | 3/2003 |
| JP | 2003-510843 | 3/2003 |

* cited by examiner

SEMICONDUCTOR DEVICE

CROSS-REFERENCE TO RELATED APPLICATIONS

This application is based upon and claims the benefit of priority from the prior Japanese Patent Application No. 2005-135890, filed on May 9, 2005; the entire contents of which are incorporated herein by reference.

BACKGROUND OF THE INVENTION

1. Field of the Invention

This invention relates to a semiconductor device having a multilayer interconnect structure including pads.

2. Background Art

Device downsizing in recent years has achieved high-speed operation of circuits. In addition, the progress of multilayer interconnection technology has enabled a number of metal layers to be laminated as interconnects. This inevitably increases metal layers constituting pads or connecting electrodes. As a result, the capacitance between metal layers and the pad-substrate capacitance have become not negligible. In this technical background, approaches to reducing pad capacitance have been increasingly required.

In this context, a large capacitance of pads has a problem of preventing high-speed operation of circuits. More specifically, interconnects have resistance in general. Thus the interconnect resistance and pad capacitance act as a low-pass filter (LPF), which cuts off high-frequency components and slows down the circuit operation. The characteristic frequency f of a low-pass filter is given by the following formula:

$$f = 1/(2\pi RC) \tag{1}$$

where R denotes the interconnect resistance and C the pad capacitance. It is seen from equation (1) that when the interconnect resistance R remains constant, the operating frequency decreases as the pad capacitance C increases. That is, large capacitance prevents high-speed operation of circuits.

In a conventional semiconductor device having a multilayer interconnect structure, semiconductor elements and integrated circuits are formed on a semiconductor substrate made of silicon or the like. These integrated circuits and other elements are electrically connected to the exterior through pads constituting a multilayer interconnect structure formed on the semiconductor substrate. That is, pads are formed in each metal interconnect layer of the multilayer interconnect structure. Current is allowed to flow from the pad formed in the top layer of the multilayer interconnect structure to the inside of the semiconductor substrate. The multilayer interconnect structure has at least two metal interconnect layers on the semiconductor substrate, and the metal interconnect layers are mutually isolated by a plurality of interlayer insulating films. Pads in upper and lower layers are electrically interconnected by a plurality of vias (contacts) formed in the interlayer insulating films. The pads of the respective layers have the same size. A wire serving as an external terminal is bonded to the pad of the top layer.

JP 2003-510843T discloses a conventional technology in which a gate or other electrode is connected via a test pad to a set of parallel fingers in a bonding pad. This arrangement can address a large misalignment in the bonding process while still achieving connection of the bonding pad portions.

SUMMARY OF THE INVENTION

According to an aspect of the invention, there is provided a semiconductor device comprises: a semiconductor substrate; and a multilayer interconnect configuration formed on the semiconductor substrate, the multilayer interconnect configuration has a plurality of pads, each pad is located in each of a plurality of interconnect layers of the multilayer interconnect configuration, and at least one of the pads has an opening formed therein.

According to other aspect of the invention, there is provided a semiconductor device comprises: a semiconductor substrate; and a multilayer interconnect configuration formed on the semiconductor substrate, the multilayer interconnect configuration has a plurality of pads, each pad is located in each of a plurality of interconnect layers of the multilayer interconnect configuration, and the area of each of the pads except the pad located in the highest position among the pads is smaller than the area of the pad located in the highest position.

According to other aspect of the invention, there is provided a semiconductor device comprises: a semiconductor substrate; and a multilayer interconnect configuration formed on the semiconductor substrate, the multilayer interconnect configuration has a plurality of pads, each pad is located in each of a plurality of interconnect layers of the multilayer interconnect configuration, and at least one of the pads has at least one notch formed therein.

DETAILED DESCRIPTION OF THE INVENTION

Embodiments of the invention will now be described.

First Embodiment

The first embodiment is described with reference to FIGS. 1 to 4.

Figure 1:
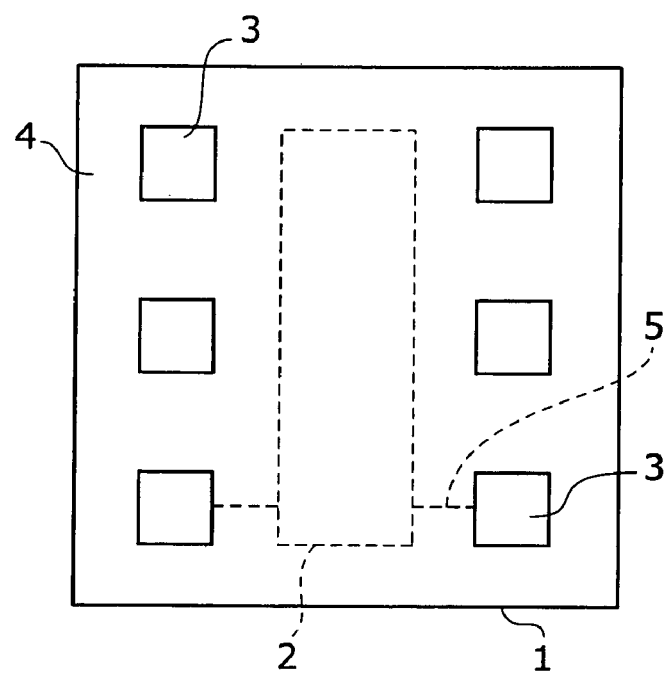
FIG. 1 is a plan view showing the surface of a semiconductor device where a semiconductor integrated circuit (LSI) formed on a semiconductor substrate in a first embodiment of the invention is shown in perspective.
Figure 2:
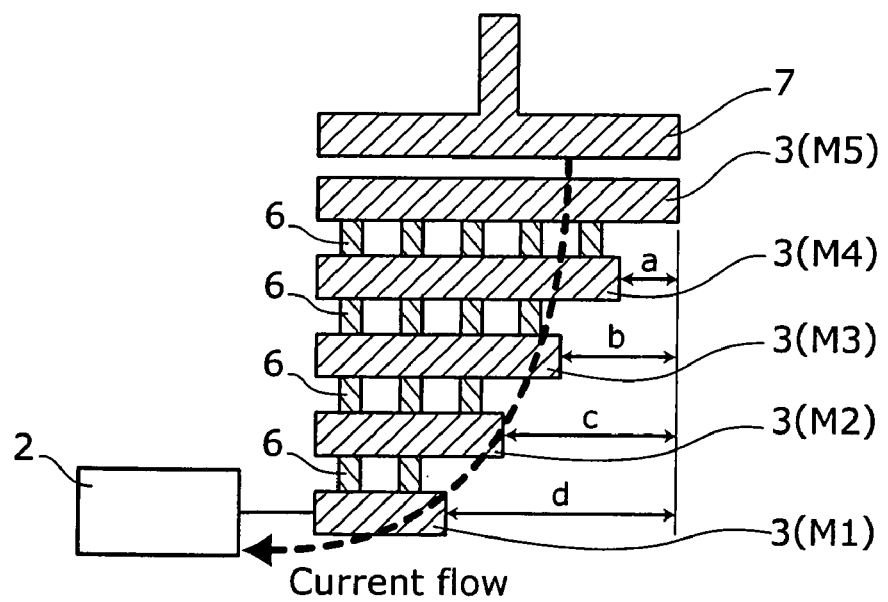
FIG. 2 is a schematic cross section illustrating the pad configuration of a multilayer interconnect structure formed in the semiconductor device of FIG. 1.
Figure 3C:
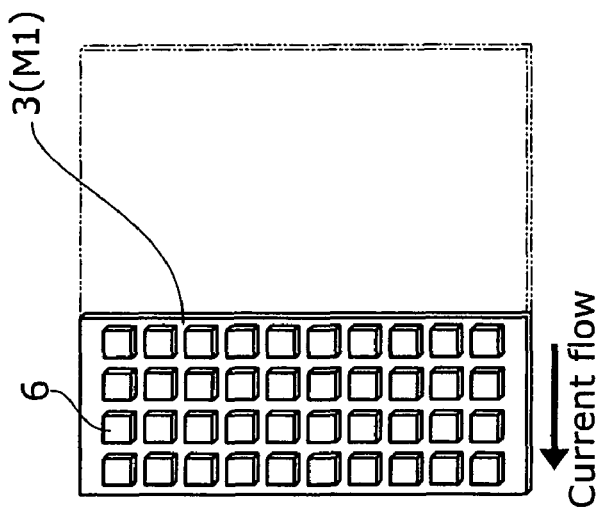
FIGS. 3A to 3C are plan views showing the shape of pads in the respective layers of FIG. 2.
Figure 3B:
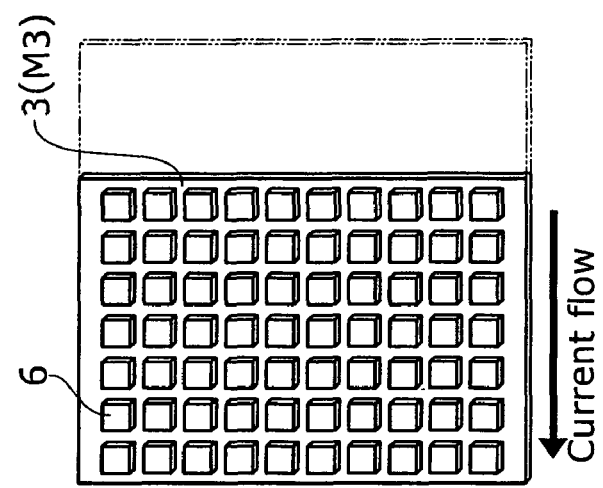
Figure 3A:
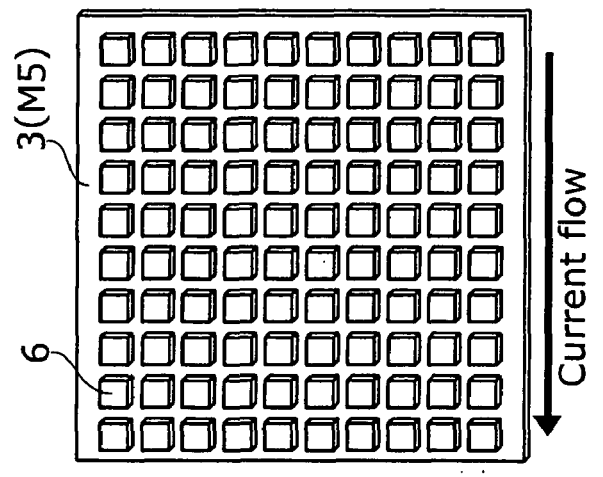
Figure 4:
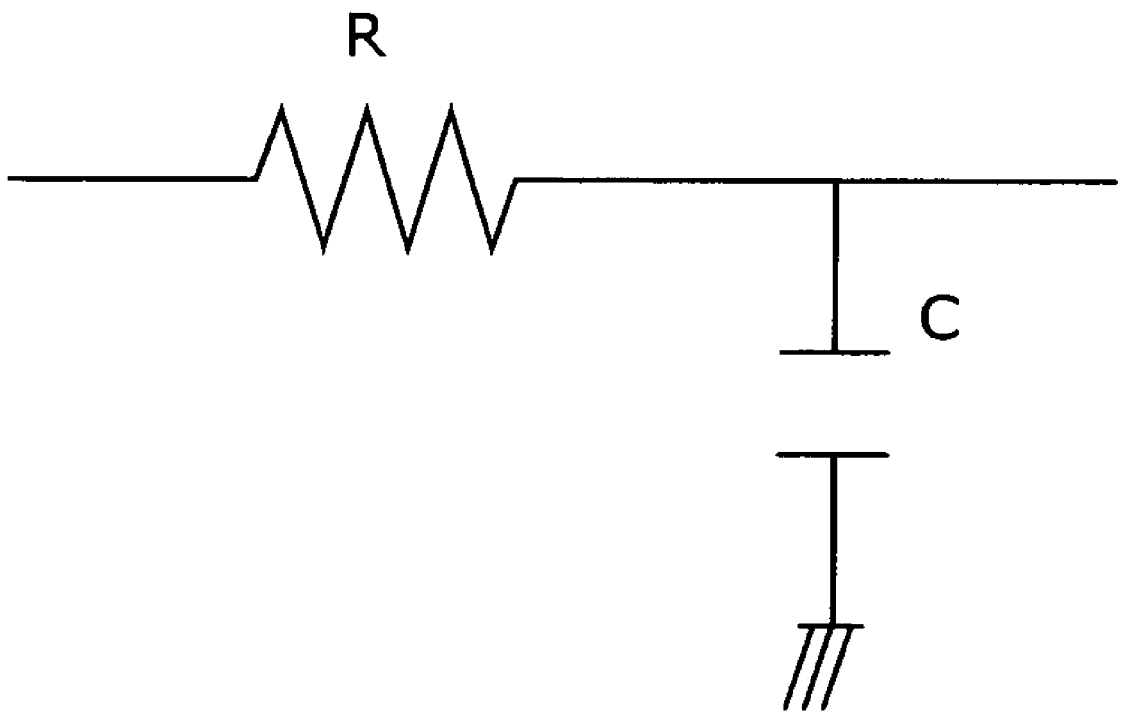
FIG. 4 is a circuit diagram of a low-pass filter (LPF) that prevents the high-speed operation of semiconductor integrated circuits.

FIG. 1 is a plan view showing the surface of a semiconductor device where a semiconductor integrated circuit (LSI) formed on a semiconductor substrate is shown in perspective, FIG. 2 is a schematic cross section illustrating the pad configuration of a multilayer interconnect structure formed in the semiconductor device of FIG. 1, FIGS. 3A to 3C are plan views showing the shape of pads in the respective layers of FIG. 2, and FIG. 4 is a circuit diagram of a low-pass filter (LPF) that prevents the high-speed operation of semiconductor integrated circuits.

In the semiconductor device shown in FIG. 1, a semiconductor integrated circuit (LSI) 2 is formed on the surface region of a semiconductor substrate 1. The surface of a multilayer interconnect structure (illustratively composed of five layers in this embodiment) formed on the semiconductor substrate 1 is covered with a passivation film 4 such as a silicon nitride or silicon oxide film, which partly exposes pads 3 that constitute the top layer interconnect of the multilayer interconnect structure. Pads 3 that constitute the bottom layer interconnect of the multilayer interconnect structure are electrically connected to the semiconductor integrated circuit (LSI) 2 through an interconnect 5. Pads in one layer are electrically connected to pads in the adjacent layer through via contacts 6 embedded in via holes formed in the interlayer insulating film (not shown).

The area of pads in the multilayer interconnect structure on the semiconductor substrate 1 successively decreases as the layer including the pads is located lower and lower as shown in FIG. 2. The pad M1 of the bottom or first layer has a direct electrical connection to the semiconductor integrated circuit. On the pad M1 of the first layer, the pads M2 to M5 of the second to fifth layers are successively stacked. The pad M5 of the fifth layer is not reduced in area and has the same standard size as the conventional pad. The pad M4 of the fourth layer, which underlies the fifth layer, is downsized by width A. The pad M3 of the third layer, which underlies the fourth layer, is downsized by width B. The pad M2 of the second layer, which underlies the third layer, is downsized by width C. The pad M1 of the first layer, which underlies the second layer, is downsized by width D. The amount of downsizing increases in the order of A<B<C<D. That is, the pads M1 to M4 other than the pad M5 of the top layer have smaller areas than the pad M5. As viewed perpendicular to the surface (from above) of the semiconductor substrate 1, the pads M1 to M5 have edges aligned with each other on the side of the junction (connecting portion) to the semiconductor integrated circuit 2, and have edges successively closer to the semiconductor integrated circuit 2 on the opposite side of the junction to the semiconductor integrated circuit 2 as the layer including the pads is located lower and lower.

In the multilayer interconnect structure shown in FIG. 2, when a current flows from an external terminal 7 (bonding) through the pads 3 and the interconnect 5 to the semiconductor integrated circuit 2, the current path in the cross-sectional structure of the pad configuration (M1 to M5) is as indicated by the arrow. More specifically, even if the area of the pads M1 to M4 of the first to fourth layers were not reduced and pads having the same shape and area as the pad M5 of the fifth layer were placed directly below the pad M5, the current would scarcely flow in the portion to the right side of each pad shown in the figure because the current flows along the arrow shown in FIG. 2. This tendency is more likely as the layer is located lower and lower. Therefore the pads can be significantly downsized on their right side as A<B<C<D in lower and lower layers (see FIGS. 3A to 3C). That is, in this embodiment, the portions where the current actually flows are left, and the portions where the current does not flow are eliminated. The eliminated portions are eliminated perpendicular to the direction of current flow (see FIGS. 3A to 3C). That is, the pads are downsized so that their length in the direction of current flow decreases.

Next, a method of forming the multilayer interconnect structure is described. On a semiconductor substrate having a semiconductor integrated circuit 2 formed thereon, through the intermediary of an insulating film, a metal layer of aluminum or its alloy to constitute an interconnect of the first layer is patterned. Thus the interconnect including the pad M1 of the first layer is formed. Here, the pad M1 is downsized so that its side in the direction of current flow is shorter than the standard size by length D. That is, the length in the direction of current flow (hereinafter also referred to as "current direction") in the pad M1 is made shorter than the standard length by D. Next, an interlayer insulating film (not shown) selected from insulating films having a low dielectric constant such as an organic film, silicon oxide film, and low-k film is formed on the semiconductor substrate to cover the interconnect including the pad M1 of the first layer. Then etching or the like is used to form via holes therein, and aluminum or other conductive films are embedded in the via holes to form via contacts 6.

Next, on the interlayer insulating film having the embedded via contacts 6, a metal layer of aluminum or its alloy to constitute an interconnect of the second layer is patterned. Thus the interconnect including the pad M2 of the second layer is formed. Here, the pad M2 is downsized so that its side in the direction of current flow is shorter than the standard size by length C. That is, the length in the current direction in the pad M2 is made shorter than the standard length by C. The pad M1 of the first layer is electrically connected to the pad M2 of the second layer through a plurality of via contacts 6.

In the same way, interlayer insulating films and the pads M3 to M5 of the third to fifth layers on the interlayer insulating films are successively formed, and the pads including the pad M2 of the second layer are electrically connected through the via contacts 6 embedded in the interlayer insulating films. Then the surface of the multilayer interconnect structure is protected by a passivation film 4. The surface of the pad M5 of the top layer is partly exposed through the passivation film 4, and a wire 7 to serve as an external terminal is bonded to this portion.

In general, the capacitance is given by the following formula:

$$C = \varepsilon \times S/d \qquad (2)$$

where $\varepsilon$ denotes the dielectric constant, S the facing area between the opposed metals (pads) or between the pad and the semiconductor substrate, and d the distance between the metals (pads) or between the pad and the semiconductor substrate. Thus the capacitance can be significantly reduced by decreasing the area. The reduction of capacitance allows for significantly reducing the effect of a low-pass filter (LPF) (see FIG. 4) produced from the interconnect metal resistance R and the pad capacitance C, which slows down the circuit operation. Therefore the high-speed operation can avoid degradation.

Second Embodiment

Next, the second embodiment is described with reference to FIGS. 5A and 5B.

Figure 5A:
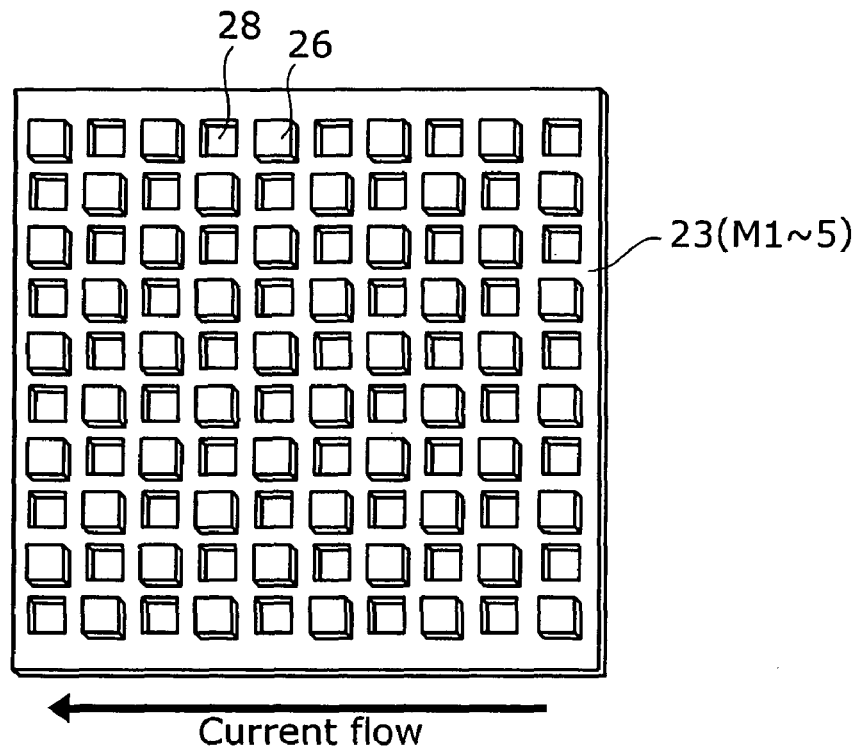
FIG. 5A is a plan view showing the shape of the pad of a multilayer interconnect structure provided in the semiconductor device of a second embodiment of the invention.
Figure 5B:
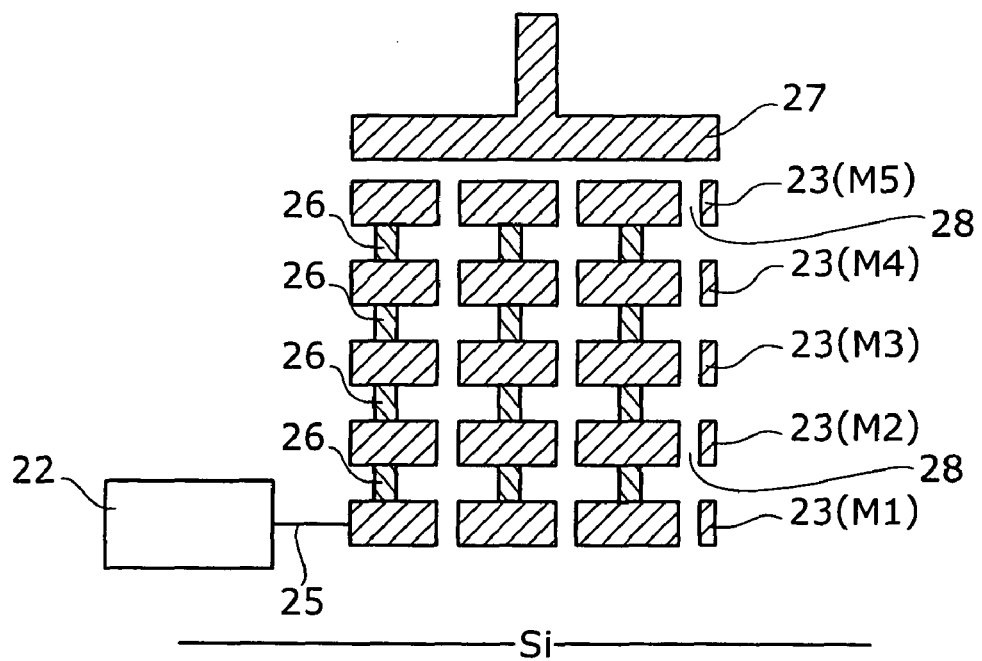
FIG. 5B is a schematic cross section illustrating the pad configuration.

FIG. 5A is a plan view showing the shape of the pad of a multilayer interconnect structure provided in the semiconductor device of a second embodiment of the invention, and FIG. 5B is a schematic cross section illustrating the pad configuration.

In the semiconductor device of this embodiment, a semiconductor integrated circuit (LSI) 22 is formed on the surface region of a semiconductor substrate. The surface of a multilayer interconnect structure (illustratively composed of five layers in this embodiment) formed on the semiconductor substrate is covered with a passivation film such as a silicon nitride or silicon oxide film, which partly exposes pads (M5) 23 that constitute the top layer interconnect of the multilayer interconnect structure. Pads (M1) 23 that constitute the bottom layer interconnect of the multilayer interconnect structure are electrically connected to the semiconductor integrated circuit (LSI) 22 through an interconnect 25.

The pads 23 (M1 to M5) in the multilayer interconnect structure on the semiconductor substrate have the same size for each layer as shown in FIG. 5B, and are the same in size as the pads used in the conventional semiconductor devices. The pad M1 of the bottom or first layer has a direct electrical connection to the semiconductor integrated circuit. On the pad M1 of the first layer, the pads M2 to M5 of the second to fifth layers are successively stacked. Thus the pads used in the second embodiment have the same size as the pads used in the conventional semiconductor devices. However, the pads (M1 to M5) of the respective layers each have openings 28, which decrease the area of the pads relative to the conventional pads. Pads in one layer are electrically connected to pads in the adjacent layer through via contacts 26 embedded in via holes formed in the interlayer insulating film (not shown). As viewed from above, the position of the via contacts 26 is displaced from the position of the openings 28. As shown in FIG. 5A, for embodiment, they are alternately arranged along two mutually orthogonal directions. Furthermore, as shown in FIG. 5B, for embodiment, as viewed from above, the openings 28 are formed at the same position, and the via contacts 26 in the respective layers are embedded at the same position.

Next, a method of forming the multilayer interconnect structure is described. On a semiconductor substrate having a semiconductor integrated circuit 22 formed thereon, through the intermediary of an insulating film, a metal layer of aluminum or its alloy to constitute an interconnect of the first layer is patterned. Thus the interconnect including the pad 23 (M1) of the first layer is formed. Here, the pad 23 (M1) has the same size as the conventional pad. Then a plurality of openings 28 are formed in the pad 23 (M1) with a prescribed spacing. Next, an interlayer insulating film (not shown) selected from insulating films having a low dielectric constant such as an organic film, silicon oxide film, and low-k film is formed on the semiconductor substrate to cover the interconnect including the pad 23 (M1) of the first layer. The interlayer insulating film is penetrated into the openings of the pad. Then etching or the like is used to form via holes in the interlayer insulating film, and aluminum or other conductive films are embedded in the via holes to form via contacts 26.

Next, on the interlayer insulating film having the embedded via contacts 26, a metal layer of aluminum or its alloy to constitute an interconnect of the second layer is patterned. Thus the interconnect including the pad 23 (M2) of the second layer is formed. The pad 23 (M2) has the same size as the pad 23 (M1). Then a plurality of openings 28 are formed in the pad 23 (M2) with a prescribed spacing. The pad 23 (M1) of the first layer is electrically connected to the pad 23 (M2) of the second layer through a plurality of via contacts 26.

In the same way, interlayer insulating films and the pads 23 (M3 to M5) of the third to fifth layers on the interlayer insulating films are successively formed, and the pads including the pad 23 (M2) of the second layer are electrically connected through the via contacts 26 embedded in the interlayer insulating films. Then the surface of the multilayer interconnect structure is protected by a passivation film (not shown). The surface of the pad 23 (M5) of the top layer is partly exposed through the passivation film, and a wire 27 to serve as an external terminal is bonded to this portion.

Conventionally, pads in each layer fully use the area of the metal layer. However, in this embodiment, as shown in FIG. 5A, the pad 23 in each layer is provided with openings to reduce its area. The via contacts 26 and the openings 28 can be alternately arranged to reduce about 50% of the area.

As described above, in this embodiment, while the step of forming openings in the pad is added, the capacitance can be significantly reduced by decreasing the area. The reduction of capacitance allows for significantly reducing the effect of a low-pass filter (LPF) (see FIG. 4) produced from the interconnect metal resistance R and the pad capacitance C, which slows down the circuit operation. Therefore the high-speed operation can avoid degradation.

While all the pads are provided with openings in this embodiment, the invention is not limited thereto. The effect of reducing capacitance is achieved by forming openings in at least one pad.

In this embodiment, the pad is provided with openings to reduce the area. However, it is also possible to additionally eliminate the portions of pads where the current does not flow as described in the first embodiment. Such simultaneous use of the two methods allows for more effective reduction of pad area.

Third Embodiment

Next, the third embodiment is described with reference to FIGS. 6A and 6B.

Figure 6A:
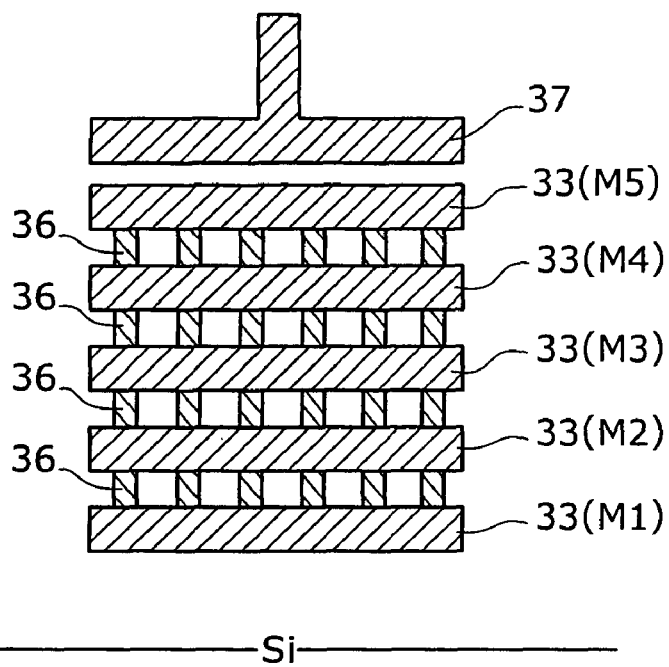
FIG. 6A is a schematic cross section illustrating the pad configuration of a multilayer interconnect structure provided in the semiconductor device of a third embodiment of the invention.
Figure 6B:
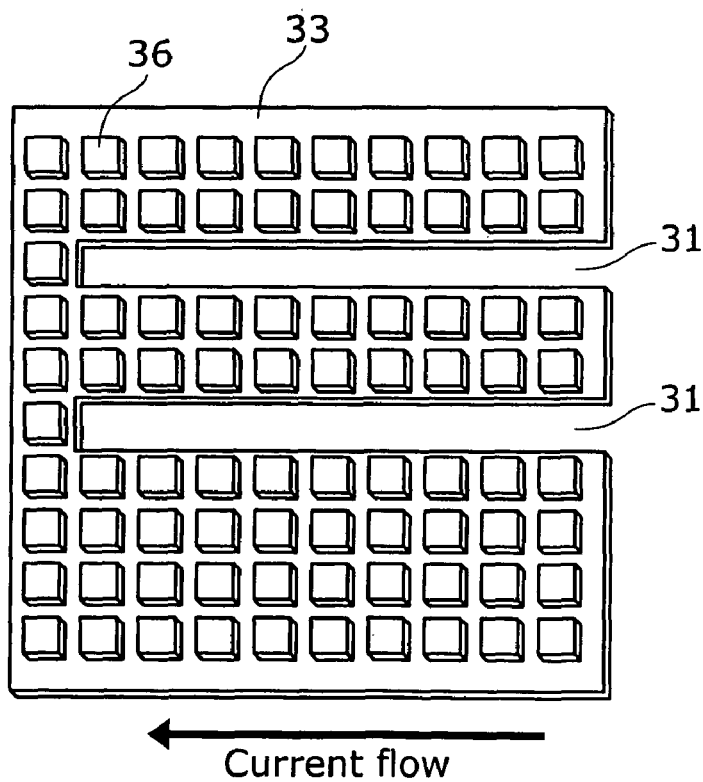
FIG. 6B is a plan view showing the shape of this pad.

FIG. 6A is a schematic cross section illustrating the pad configuration of a multilayer interconnect structure provided in the semiconductor device, and FIG. 6B is a plan view showing the shape of this pad.

In the semiconductor device of this embodiment, a semiconductor integrated circuit (not shown) is formed on the surface region of a semiconductor substrate. The surface of a multilayer interconnect structure (illustratively composed of five layers in this embodiment) formed on the semiconductor substrate is covered with a passivation film such as a silicon nitride or silicon oxide film, which partly exposes pads (M5) 33 that constitute the top layer interconnect of the multilayer interconnect structure. Pads (M1) 33 that constitute the bottom layer interconnect of the multilayer interconnect structure are electrically connected to the semiconductor integrated circuit through an interconnect.

The pads 33 (M1 to M5) in the multilayer interconnect structure on the semiconductor substrate have the same size for each layer as shown in FIG. 6B, and are the same in size as the pads used in the conventional semiconductor devices. The pad 33 (M1) of the bottom or first layer has a direct electrical connection to the semiconductor integrated circuit. On the pad 33 (M1) of the first layer, the pads M2 to M5 of the second to fifth layers are successively stacked. Thus the pads used in the third embodiment have the same size as the pads used in the conventional semiconductor devices. However, the pads 33 (M1 to M5) of the respective layers each have a plurality of notches 31 along the direction of current flow, and thereby have a comb configuration. The notch 31 extends in a straight line from the edge of the pad 33 on the opposite side of the junction to the semiconductor integrated circuit toward the edge on the junction side, but does not reach the edge on the junction side. The notches 31 decrease the area of the pads 33 relative to the conventional pads. Pads in one layer are electrically connected to pads in the adjacent layer through via contacts 36 embedded in via holes formed in the interlayer insulating film (not shown). As viewed from above, for embodiment, the notches 31 formed in the pads 33 of the respective layers have the same shape and are located at the same position.

The method of forming the multilayer interconnect structure of this embodiment is not described because it is the same as the method for the second embodiment except that the step of forming notches in the pad is conducted instead of the step of forming openings in the pad. Conventionally, pads in each layer fully use the area of the metal layer. However, in this embodiment, the pad in each layer has a comb configuration with notches to reduce its area.

As described above, in this embodiment, while the step of forming notches in the pad in parallel with the direction of current flow is added, the capacitance can be significantly reduced by decreasing the area. On the other hand, the effective resistance of the pad is scarcely increased because the notches are formed along the current direction. The reduction of capacitance with keeping the resistance constant allows for significantly reducing the effect of a low-pass filter (LPF) (see FIG. 4) produced from the interconnect metal resistance R and the pad capacitance C, which slows down the circuit operation. Therefore the high-speed operation can avoid degradation.

In this embodiment, the pad has a comb configuration with notches in parallel with the direction of current flow to reduce the area. However, it is also possible to additionally form openings in the pad as described in the second embodiment. Such simultaneous use of the two methods allows for more effective reduction of pad area.

Fourth Embodiment

Next, the fourth embodiment is described with reference to FIGS. 7A and 7B.

Figure 7A:
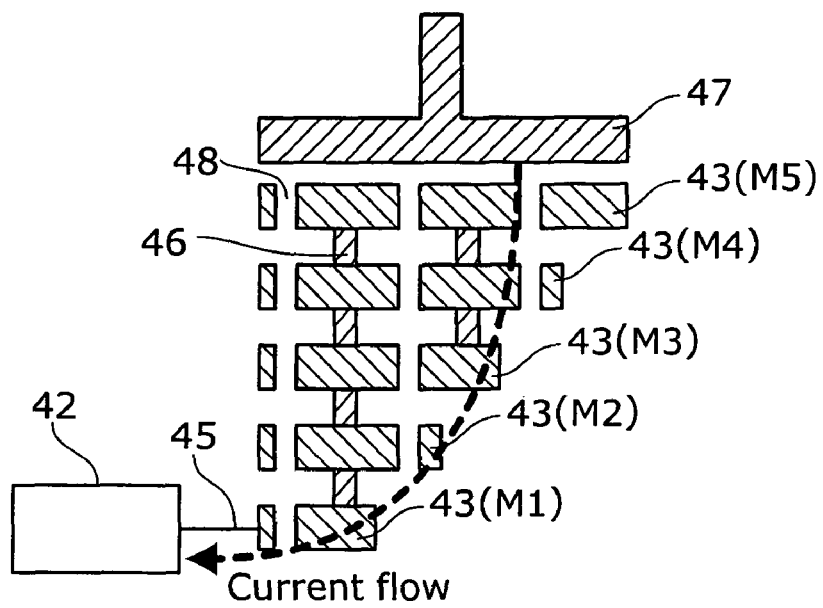
FIG. 7A is a schematic cross section illustrating the pad configuration of a multilayer interconnect structure provided in the semiconductor device of a fourth embodiment of the invention.
Figure 7B:
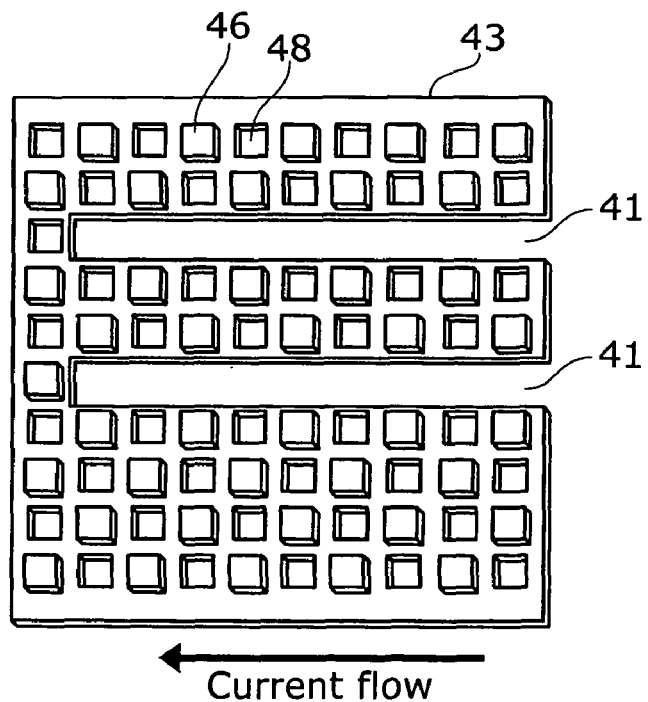
FIG. 7B is a plan view showing the shape of this pad.

FIG. 7A is a schematic cross section illustrating the pad configuration of a multilayer interconnect structure provided in the semiconductor device, and FIG. 7B is a plan view showing the shape of this pad.

In the semiconductor device shown in FIGS. 7A and 7B, a semiconductor integrated circuit (LSI) 42 is formed on the surface region of a semiconductor substrate. The surface of a multilayer interconnect structure (illustratively composed of five layers in this embodiment) formed on the semiconductor substrate is covered with a passivation film (not shown) such as a silicon nitride or silicon oxide film, which partly exposes pads 43 that constitute the top layer interconnect of the multilayer interconnect structure. Pads 43 (M1) that constitute the bottom layer interconnect of the multilayer interconnect structure are electrically connected to the semiconductor integrated circuit (LSI) 42 through an interconnect 45. Pads in one layer are electrically connected to pads in the adjacent layer through via contacts 46 embedded in via holes formed in the interlayer insulating film (not shown).

The area of pads 43 in the multilayer interconnect structure on the semiconductor substrate 1 successively decreases as the layer including the pads is located lower and lower as shown in FIG. 7A. More specifically, as viewed from above, the pads M1 to M5 have edges aligned with each other on the side of the junction to the semiconductor integrated circuit 42, and have edges successively closer to the semiconductor integrated circuit 42 on the opposite side of the junction to the semiconductor integrated circuit 42 as the layer including the pads is located lower and lower. Furthermore, each pad 43 is provided with a plurality of openings 48. Moreover, each pad 43 is provided with a plurality of notches 41 that extend from the edge on the opposite side of the junction to the semiconductor integrated circuit 42 toward the edge on the junction side. That is, each pad 43 has a comb configuration with a plurality of notches 41 in parallel with the direction of current flow.

The pad M1 of the bottom or first layer has a direct electrical connection to the semiconductor integrated circuit. On the pad M1 of the first layer, the pads M2 to M5 of the second to fifth layers are successively stacked. The pad M5 of the fifth layer is not reduced in area and has the same standard size as the conventional pad. The pad M4 of the fourth layer, which underlies the fifth layer, is downsized by a prescribed width. The pad M3 of the third layer, which underlies the fourth layer, is downsized by a width larger than for the pad M4. The pad M2 of the second layer, which underlies the third layer, is downsized by a width larger than for the pad M3. The pad M1 of the first layer, which underlies the second layer, is downsized by a width larger than for the pad M2.

In the multilayer interconnect structure shown in FIG. 7A, when a current flows from an external terminal (bonding) 47 through the pads 43 (M1 to M5) and the interconnect 45 to the semiconductor integrated circuit 42, the current path in the cross-sectional structure of the pad configuration (M1 to M5) is as indicated by the arrow. That is, the current would scarcely flow in the portion to the right side of each pad. This tendency is more likely as the layer is located lower and lower. Therefore the pads can be significantly downsized on their right side in lower and lower layers. That is, in this embodiment, the portions where the current actually flows are left, and the portions where the current does not flow are eliminated. The eliminated portions are eliminated perpendicular to the direction of current flow (FIG. 7A).

Next, a method of forming the multilayer interconnect structure is described. On a semiconductor substrate having a semiconductor integrated circuit 42 formed thereon, through the intermediary of an insulating film, a metal layer of aluminum or its alloy to constitute an interconnect of the first layer is patterned. Thus the interconnect including the pad M1 of the first layer is formed. Here, the pad M1 is downsized so that its side in the direction of current flow is shorter than the standard size by a prescribed length. Next, notches 41 are formed in the pad M1 in parallel with the direction of current flow, and a plurality of openings 48 are formed by etching or the like.

Next, an interlayer insulating film (not shown) selected from insulating films having a low dielectric constant such as an organic film, silicon oxide film, and low-k film is formed on the semiconductor substrate to cover the interconnect including the pad M1 of the first layer. Then etching or the like is used to form via holes therein, and aluminum or other conductive films are embedded in the via holes to form via contacts 46.

Next, on the interlayer insulating film having the embedded via contacts 46, a metal layer of aluminum or its alloy to constitute an interconnect of the second layer is patterned. Thus the interconnect including the pad M2 of the second layer is formed. Here, the pad M2 is downsized so that its side in the direction of current flow is shorter than the standard size by a length. Next, notches 41 are formed in the pad M2 in parallel with the direction of current flow, and a plurality of openings 48 are formed by etching or the like. The pad M1 of the first layer is electrically connected to the pad M2 of the second layer through a plurality of via contacts 46.

In the same way, interlayer insulating films and the pads M3 to M5 of the third to fifth layers on the interlayer insulating films are successively formed, and the pads including the pad M2 of the second layer are electrically connected through the via contacts 46 embedded in the interlayer insulating films. Next, in each of the pads M3 to M5, notches 41 are formed in parallel with the direction of current flow, and a plurality of openings 48 are formed by etching or the like. Then the surface of the multilayer interconnect structure is protected by a passivation film (not shown). The surface of the pad M5 of the top layer is partly exposed through the passivation film, and a wire 47 to serve as an external terminal is bonded to this portion.

As described above, in this embodiment, the capacitance can be significantly reduced by combining the three methods to reduce the area. The reduction of capacitance allows for significantly reducing the effect of a low-pass filter (LPF) (see FIG. 4) produced from the interconnect metal resistance R and the pad capacitance C, which slows down the circuit operation. Therefore the high-speed operation can avoid degradation.

Thus the methods of decreasing the area of pads to reduce the capacitance as proposed above can be used simultaneously, allowing for significantly reducing the capacitance as compared to the conventional pads. However, for embodiment, when a large current flows through the pad, excessive reduction of pad metal may prevent the intended flow of current. In such situations, instead of incorporating all the proposed methods, some of them should be selected and combined on a case-by-case basis.

Fifth Embodiment

Next, the fifth embodiment is described with reference to FIG. 8.

Figure 8:
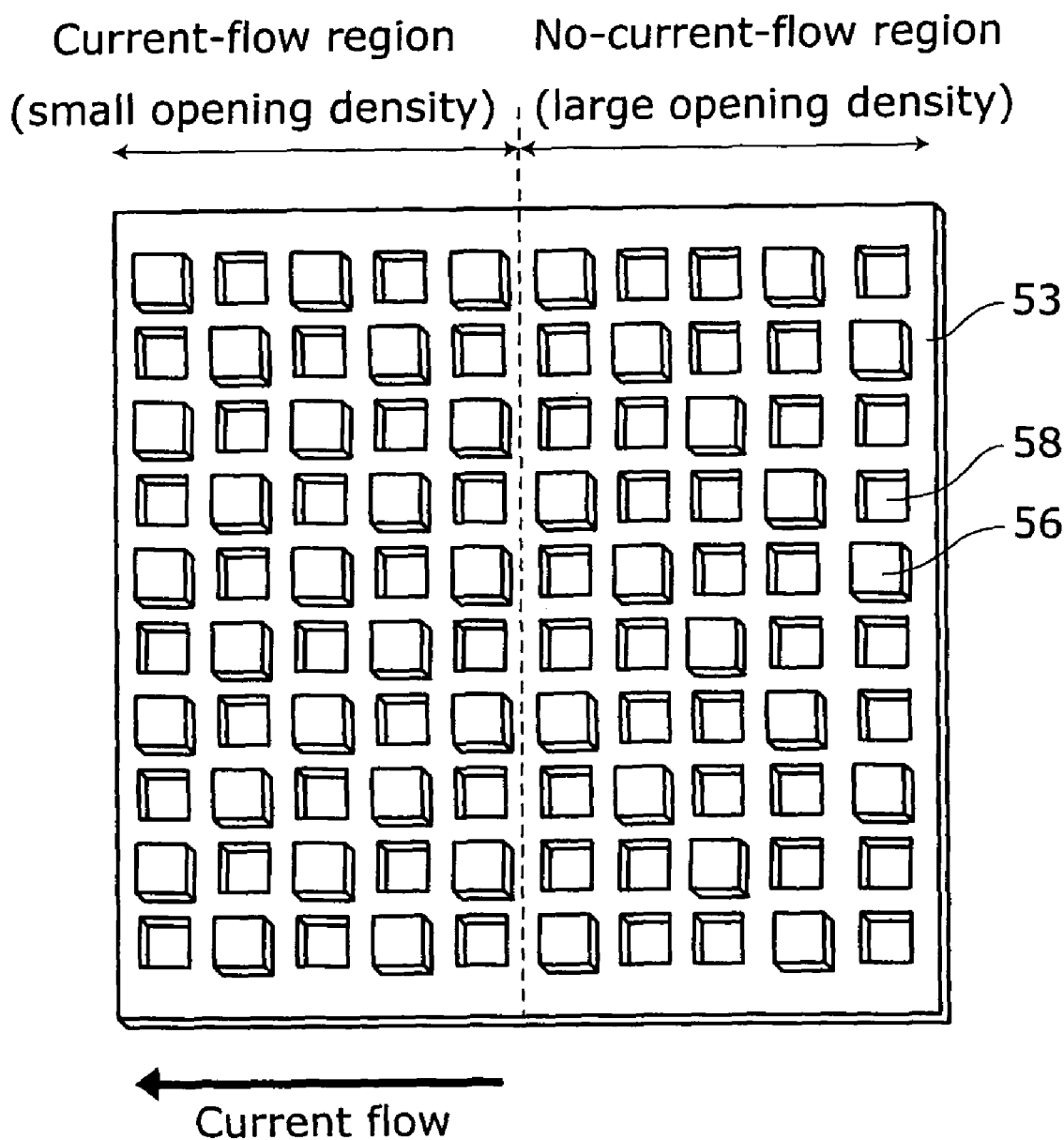
FIG. 8 is a plan view showing the pad shape of the semiconductor device of a fifth embodiment of the invention.

FIG. 8 is a plan view showing the pad shape of a semiconductor device. The method used in this embodiment is the same as the method of reducing the pad area by forming openings in the pad as described in the second embodiment. For embodiment, when a current is passed through the semiconductor device shown in FIG. 1, the path of the current in the cross-sectional structure of pads is constant in the direction as indicated by the arrow. Therefore the current scarcely flows in the right side of each pad. This tendency is more likely as the layer is located lower and lower. Therefore the pads can be significantly downsized on their right side in lower and lower layers.

This embodiment is based on these findings. In each pad, the area of openings are relatively increased in the region where only a relatively small current flows (also hereinafter referred to simply as "no-current-flow region"), and the area of openings are relatively decreased in the region where a relatively large current flows (also hereinafter referred to simply as "current-flow region"). As shown in FIG. 8, in the current-flow region of the pad 53, the via contacts 56 and the openings 58 are alternately arranged, for embodiment. Therefore the pad area is decreased by about 50% in this region. On the other hand, in the no-current-flow region, two openings 58 are arranged between two via contacts 56, for embodiment. Therefore the pad area is decreased by about 67% in this region.

In order to decrease the pad area, the opening size in the no-current-flow region may be made larger than the opening size in the current-flow region. Alternatively, the no-current-flow region may be eliminated from the pad (see the first embodiment). Further alternatively, openings may be formed only in the no-current-flow region and not in the current-flow region. In this case, openings may be omitted from the pad of the top layer.

As described above, in this embodiment, while the step of forming openings in the pad is added, the pad area can be effectively decreased by varying the density of openings between the current-flow and no-current-flow regions. The capacitance can be significantly reduced by decreasing the pad area. The reduction of capacitance allows for significantly reducing the effect of a low-pass filter (LPF) (see FIG. 4) produced from the interconnect metal resistance R and the pad capacitance C, which slows down the circuit operation. Therefore the high-speed operation can avoid degradation.

Figure 9:
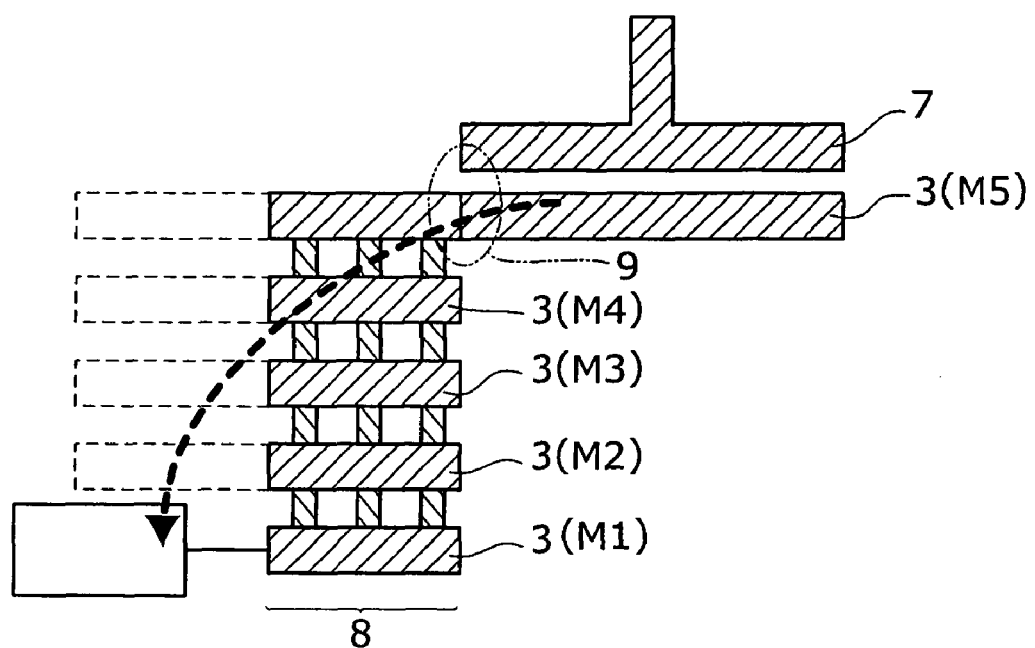
FIGS. 9 and 10 are schematic cross sections illustrating the pad configuration of a multilayer interconnect structure formed in a prototyped semiconductor device.
Figure 10:
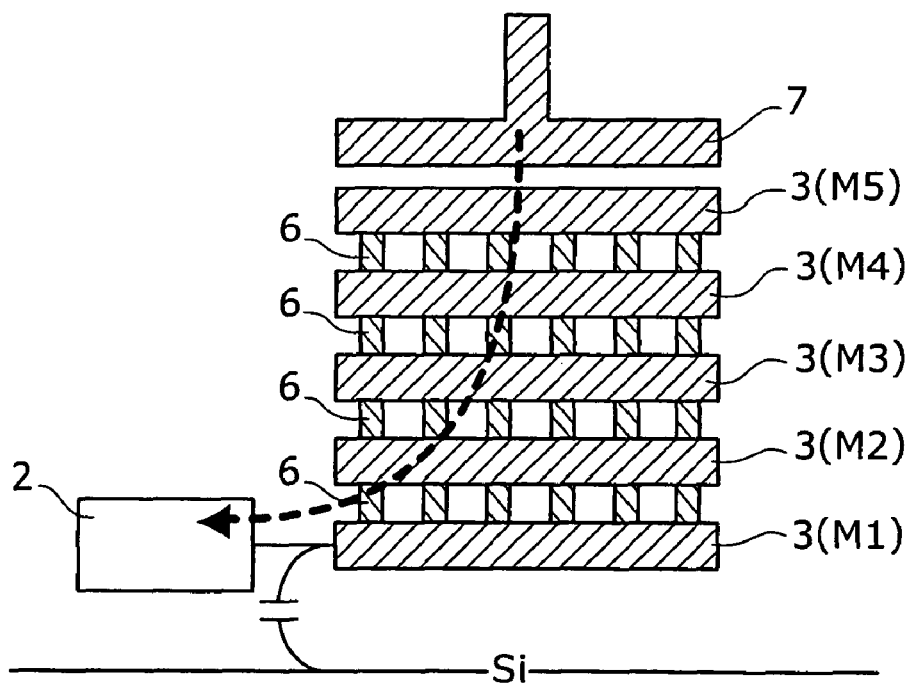

In general, high-speed operation of a semiconductor device requires a large amount of current flow. To this end, as a prototype, a portion 8 called "neck" is provided beside the pad of the top layer as shown in FIG. 9 to serve as a current path so that a large current flows therethrough. The "neck" portion 8 is configured with many vias interconnecting multilayer pads to allow for a large current flow. However, such a pad configuration has a portion 9 with a high current density (high-current-density portion) between the pad 3 in contact with a bonding portion 7 and the "neck" portion 8. This portion 9 makes the configuration suboptimal. Thus, as a prototype, a pad configuration of FIG. 10 is contemplated. This configuration has no portion with high current density between the bonding portion 7 and the pad 3, because an extremely high current density will not occur when a current flows from the integrated circuit (LSI) toward the bonding wire. However, this configuration has a problem of increased parasite capacitance. This is highly problematic in semiconductor devices aiming at high-speed operation.

In contrast, the pad configuration of the invention as illustrated in FIG. 1 and the like has no portion with high current density, and at the same time the parasite capacitance is reduced by decreasing the metal area. Therefore an optimal pad configuration is achieved. The dotted arrows shown in FIGS. 9 and 10 indicate the current flow.

In the embodiments described above, the pad (M1) formed in the bottom layer of the multilayer interconnect is connected to the semiconductor integrated circuit (LSI). However, the invention is not limited thereto. In the embodiments described above, the pad of the top layer of the semiconductor device is connected to the exterior of the semiconductor device, and is connected to the pad of the bottom layer through the pads of the intermediate layers and the via contacts provided between the pads. The pad of the bottom layer is connected to a certain component inside the semiconductor device. For convenience to describe this configuration in the embodiments described above, the target to which the pad of the bottom layer is connected is generally referred to as the "semiconductor integrated circuit". More specifically, the target to which the pad of the bottom layer is connected may be an interconnect or an element such as a transistor, resistor, or capacitor that constitutes the semiconductor integrated circuit, or may be an element or interconnect that is not part of the semiconductor integrated circuit.

The metal interconnect layer where the pad M1 is located may not necessarily be the bottom layer in the multilayer interconnect configuration. That is, one or more additional metal layers may be provided below the metal interconnect layer where the pad M1 is located. Likewise, the metal interconnect layer where the pad M5 is located may not necessarily be the top layer in the multilayer interconnect configuration. That is, one or more additional metal layers may be provided above the metal interconnect layer where the pad M5 is located. In this case, however, the region directly above the connecting region of the pad M5 should have openings to expose the connecting region so that the pad M5 can be connected to an external terminal.

The invention claimed is:

1. A semiconductor device comprising:
a semiconductor substrate;
an element provided on the semiconductor substrate; and
a multilayer interconnect configuration formed on the element, a multilayer pad outside the multilayer interconnect configuration, the multilayer pad having a plurality of pads, each pad being located in each of a plurality of interconnect layers of the multilayer pad, and at least one of the pads having a plurality of openings formed therein, wherein:
a first pad located in a highest position among the pads is configured for connection exterior to the semiconductor device,
a second pad located in a lowest position among the pads is connected to the element provided on the semiconductor substrate,
each of the pads except the first pad is formed in at least part of a region directly below a pad in an upper layer,
the multilayer interconnect configuration has via contacts interconnecting the pads in adjacent interconnect layers, and
arrangements of the via contacts and the openings are configured in a grid, wherein each of the via contacts and each of the openings are alternately arranged, and a pitch of the via contacts and a pitch of the openings are substantially equal from a perspective above the semiconductor substrate.

2. A semiconductor device according to claim 1, further comprising a semiconductor integrated circuit formed on the semiconductor substrate, wherein the pads of the multilayer interconnect configuration are electrically connected to the semiconductor integrated circuit through an interconnect, an external current flowing from the top interconnect layer through the bottom interconnect layer of the multilayer interconnect configuration to the semiconductor integrated circuit, and the density of openings in a portion of the pads where the current flows is zero or smaller than the density of openings in a portion of the pads where the current does not flow.

3. A semiconductor device according to claim 2, where in at least one of the pads, the density of openings in a region on the side of a junction to the element is smaller than the density of openings in a region on the opposite side of the junction.

4. A semiconductor device according to claim 2, wherein as viewed from above, the pads have edges aligned with each other on the side of a junction to the element, and have edges successively closer to the junction on the opposite side of the junction as the layer including the pads is located lower and lower.

5. A semiconductor device according to claim 1, wherein at least one of the pads, the density of openings in a region on the side of a junction to the element is smaller than the density of openings in a region on the opposite side of the junction.

6. A semiconductor device according to claim 5, wherein as viewed from above, the pads have edges aligned with each other on the side of a junction to the element, and have edges successively closer to the junction on the opposite side of the junction as the layer including the pads is located lower and lower.

7. A semiconductor device according to claim 1, wherein as viewed from above, the pads have edges aligned with each other on the side of a junction to the element, and have edges successively closer to the junction on the opposite side of the junction as the layer including the pads is located lower and lower.

8. A semiconductor device comprising:
a semiconductor substrate; and
a multilayer interconnect configuration formed on the semiconductor substrate, the multilayer interconnect configuration having a plurality of pads, each pad being located in each of a plurality of interconnect layers of the multilayer interconnect configuration, and at least one of the pads having a plurality of openings formed therein, wherein:
a first pad located in a highest position among the pads is configured for connection exterior to the semiconductor device,
a second pad located in a lowest position among the pads is connected to an element provided on the semiconductor substrate or the multilayer interconnect configuration,
each of the pads except the first pad is formed in at least part of a region directly below a pad in an upper layer,
the multilayer interconnect configuration has via contacts interconnecting the pads in adjacent interconnect layers, and
arrangements of the via contacts and the openings are configured in a grid, wherein each of the via contacts and each of the openings are alternately arranged, and a pitch of the via contacts and a pitch of the openings are substantially equal from a perspective above the semiconductor substrate;
wherein at least one of the pads has notches extending from an edge on the opposite side of a junction to the element toward an edge on the junction side.

9. A semiconductor device according to claim 8 where in at least one of the pads the density of openings in a region on the side of a junction to the element is smaller than the density of openings in a region on the opposite side of the junction.

10. A semiconductor device according to claim 8, wherein as viewed from above, have edges aligned with each other on the side of a junction to the element, and have edges successively closer to the junction on the opposite side of the junction as the layer including the pads is located lower.

* * * * *